March 22, 1960 K. LEHOVEC 2,929,923
LIGHT MODULATION DEVICE
Filed Aug. 19, 1954
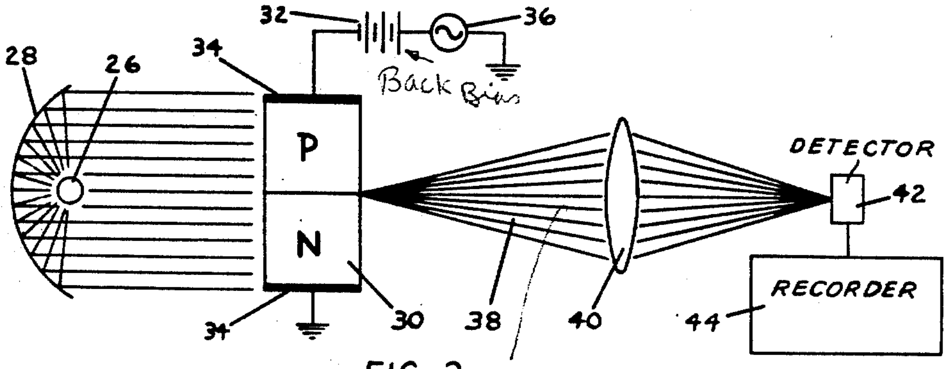
FIG. 2
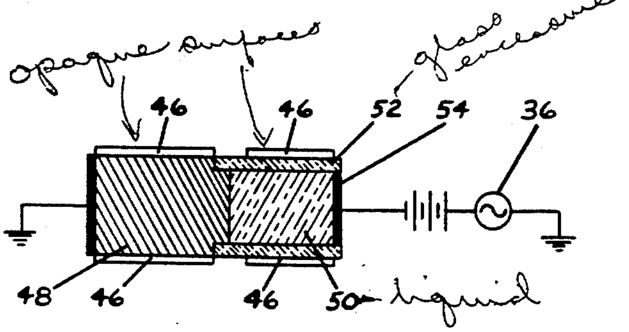
FIG. 3
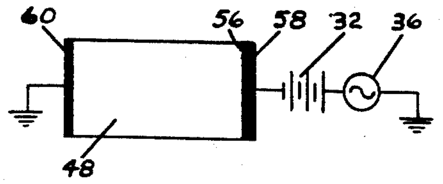
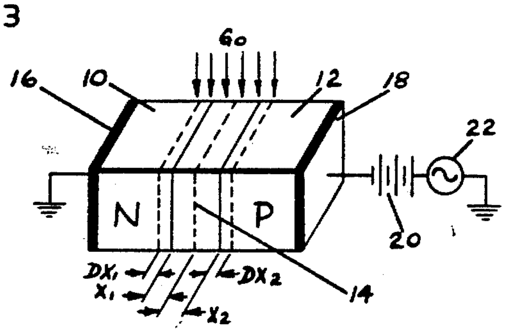
FIG. 4 FIG. 1
INVENTOR.
KURT LEHOVEC
BY
Connolly and Hutz
HIS ATTORNEYS

United States Patent Office 2,929,923

Patented Mar. 22, 1960

2,929,923

LIGHT MODULATION DEVICE

Kurt Lehovec, Williamstown, Mass., assignor to Sprague Electric Company, North Adams, Mass., a corporation of Massachusetts Application August 19, 1954, Serial No. 450,858

4 Claims. (Cl. 250—7)

This invention relates to modulation of electromagnetic radiation by an electrical device and more particularly to such a device wherein the modulation element is a body of semiconductive material having a space charge region.

In many types of optical equipment electromagnetic radiation including light is made to pass through a slit and the radiation modulated by variation in the width of the slit. The usual procedure has been an apparatus in which the slit consists of at least two blades which are moved mechanically against each other so as to vary the slit width. A severe disadvantage of this type of arrangement is that the variation of the slit width is restricted to comparatively long times so that the modulation of the light intensity at frequencies in the megacycle region cannot be achieved.

There also exists electrical devices which have been proposed for modulation of electromagnetic radiation by variation of absorption of the radiation in a semiconducting body. This absorption of electromagnetic radiation in a semiconductor depends upon the presence of free carriers in the body. The concentration of these free carriers, electrons and holes, are varied by means of electrical fields applied to the semiconductor body. One such device utilizes the injection of minority carriers through a rectifying contact for increasing the number of free carriers and thereby effects an increase in the absorption of infra-red radiation. For the purposes of this application, such semiconductor devices that modulate radiation by variation in the concentration of free carriers through injection are designated as injection modulation devices. These electrical devices utilizing injection modulation are satisfactory for modulation frequencies only in the kilocycle range which greatly limits their utility. This limitation arises because the modulation time constant is determined essentially by the lifetime of the minority carriers.

It is an object of this invention to overcome the foregoing and related disadvantages of presently known devices useful for modulation of electromagnetic radiation. It is a further object of this invention to produce a modulator of electromagnetic radiation using an electrical device of high input impedance and extremely short time constant of response. Further objects and advantages of this invention will be apparent from the following description and appended claims.

The objects of this invention have been achieved with the utilization of a semiconductor body containing a charge region characterized by the absence of electrons and holes. Such a body is suitable for modulation of electromagnetic radiation at frequencies up to and including the megacycle range.

In a more restricted sense the objects of this invention have been achieved by projection of electromagnetic radiation upon a semiconductor body having a p-n junction, said p-n junction being biased in the blocking direction by means of an imposed potential, and means for variation of said biased potential in an alternating fashion.

This invention is featured by a semiconductor body of indium-antimonide having a boundary joining zones of opposite types of conductivity with impurities of cadmium and tellurium. This crystal is particularly sensitive to absorption of electromagnetic radiation by the presence of minority carriers.

Although the theory of the invention is not fully understood, it has been found that it is possible to use the region adjacent to a p-n junction as an optical window for electromagnetic radiation. This region adjacent to the junction is characterized by the absence of free carriers, electrons and holes. The width of the region varies with applied potential which variation of width is relative to the magnitude of potential applied to the p-n junction in the blocking direction. This variation in width of the charge region, which for purposes of this application is designated a gate, responds to the applied potential up to a maximum frequency dictated only by the RC constant of the circuitry and/or the relaxation time of the bulk semiconductor. This means it is possible to modulate at frequencies up to several hundred megacycles by following the teachings of this invention.

To fully understand the scope of the invention reference should be made to the drawings in which:

Fig. 1 is a pictorial view of an n-p junction semiconductor body;

Fig. 2 diagrammatically portrays a complete system of intelligence transmission by means of modulated electromagnetic radiation;

Figs. 3 and 4 portray in cross-section further semiconductor elements suitable for practice of the invention.

In Fig. 1, 10 and 12 refer to the n and p type conductivity regions, respectively, while 14 indicates the junction region. Ohmic contacts 16 and 18 are connected to the n and p type regions 10 and 12 so as to provide the blocking bias and modulating signal. The power supply 20 has its negative terminal connected to the p portion of the crystal, thus biasing the n-p junction in the blocking direction. The modulating means is indicated by 22.

As an example indicating the gate modulator of this invention a junction crystal of Ge, the n region being doped with an impurity of arsenic and the p region with an impurity of gallium, was formed with a p-n junction having cross-sectional dimensions —0.5 cm.$\times$0.01 cm. This body was found to have a capacitance of 10 mmfd. corresponding to a junction width of $5\times10^{-4}$ cm. For incident radiation of 2.0 microns having an intensity of 1 watt/cm.$^2$ there is obtained a variation in output of approximately $10^{-11}$ watts per volt change in blocking potential. A further embodiment is a crystal of indium-antimonide having cadmium and tellurium of properly chosen concentration, e.g. $10^{18}$ atoms of tellurium per cubic centimeter and $10^{19}$ atoms of cadmium per cubic centimeter added to produce the two types of conductivity. With radiation of three microns wavelength incident upon the crystal at the p-n junction a change in blocking potential of 10 volts produces a change of over fifty percent in energy transmitted through the crystal.

In the development of the disclosure so far various impurities have been set forth. These impurities and their incorporation into the crystal to produce the junction is well known in the art and needs little amplification in the discussion of this invention. The significant aspect is the availability of the junction crystal so that "gate" modulation can be produced. Briefly then, it is necessary to have a semiconductor appropriate to the signal transmitted—namely, that the bulk should be opaque to the frequency with transmission only in the region of the junction. These germanium, silicon, indium-antimonide and other semiconductors can be used with appropriate impurities as boron, aluminum, gallium, indium (group 5 of periodic table) and phosphorous, arsenic, antimony, bismuth (group 3) for the first two and cadmium and tellurium for the latter.

The electromagnetic spectrum of wave lengths susceptible to gate modulation by the semiconductor devices herein described include those wave lengths that are longer than X-rays. The only restriction as indicated above is that the crystal in the region void of free carriers should be transparent to the electromagnetic radiation and where free carriers (electrons and holes) are present be substantially opaque. Thus for Ge the wave lengths are 1.7 microns and longer including radio short waves (millimeter wave lengths) and for silicon the radiation suitably modulated is of 1.1 microns and longer to wave lengths of the millimeter range.

Refer now to Figure 2 of the attached drawings which represent in simplified form an intelligence transmitting device assembled in accordance with the teachings of this invention. A source of electromagnetic radiation 26 is beamed by means of a moist or other type of optical lens 28 against the surface of the p-n junction crystal 30. The crystal is biased by means of the power supply 32 in the blocking direction. Contacts 34 at both ends of the crystal 30 are of the low ohmic type, for example, soldered on nickel electrodes. Included in the crystal circuit in the modulating element 36 which varies the magnitude of the potential imposed upon the junction crystal in the blocking direction. The variation in blocking potential results in increasing variations of electromagnetic radiation transmitted through the crystal at the space charge region void of free carriers. The modulated eletcromagnetic radiation 38 is beamed by means of an optic lens 40 to the receiver. This receiver would include a detecting element 42 and the intelligence recording portion 44. The detectnig element for the modulated electromagnetic radiation might include such substance as responsive to infra-red type electromagnetic radiation as a thermocouple or lead sulfide cell.

In a junction crystal such as shown in Figs. 1 and 2 there is some transmission of electromagnetic radiation through the region of the semiconductive crystal wherein free carriers are present as the absorption of the radiation by minority and free carriers is not complete, thus the crystal in this region is not fully opaque to the instant radiation. With such a crystal the overall background signal may be substantial. In Fig. 3 is shown a modification to the junction crystal which can also equally well be practiced on the modifications shown in Figs. 1 and 2. This modification consists of mirrors to the instant electromagnetic radiation imposed over the surface of the crystal except at the region of modulation, namely that region adjacent to the junction. These mirrors are indicated by the numeral 46 and are seen to be used on both before and aft sides of the crystal junction so as to effect substantially complete non-transmission of the instant radiation on the regions which it is desired to be opaque to such radiation. The junction crystal shown in Fig. 3 is not the common n-p type portrayed in Figs. 1 and 2 but consists essentially of a crystal 48 of one type of conductivity having imposed at one end a liquid system 50 which results in a rectifying barrier at the boundary between the liquid and the crystal. For purposes of illustration of how this could be accomplished the liquid is obtained within a glass enclosure 52 secured to the crystal 48 and sealed at the end by a metal electrode 54 such as copper or silver. The liquid enclosed within the glass walls 52 could be any type which forms a rectifying boundary between the liquid and the semi-conductor crystal and includes mercury and electrolytes such as an aqueous solution of potassium hydroxide. With reference again to the mirrors 46, they extend to within a centimeter or so of the boundaries between the crystal and the liquid and may be of any material which will reflect electromagnetic radiation such as polished surfaces of metal such as silver and aluminum. Further examination of Fig. 2 will show the biased potential imposed upon the gate modulating assembly and the modulating signal 36.

A further embodiment with which the gate modulation technique may be practiced includes the crystal shown in Fig. 4, which crystal is produced by plating certain types of metals onto a semiconductor crystal such as silicon. The crystal 48 thus has plated onto one side a metal such as zinc and indium which forms a rectifying boundary between the two elements. The boundary is indicated by No. 56 and the plated metal by 58. At the other end of the crystal one has a low ohmic contact 60 produced as indicated above. Included also in this modulation assembly is the blocking bias 32 and the modulating element 36. If it is desired to limit the background, suitable shielding of the crystal or modulator assembly, as well as proper beaming of the electromagnetic radiation so that it is only projected at the region adjacent to the junction, can be utilized.

Many of the advantages of the utility of my invention are apparent from the preceding discussions. The particularly important result produced by the use of this invention is that it is now possible to modulate electromagnetic radiation at frequencies up to and including the megacycle range. This opens wide fields of intelligence transmission, particularly that which was designed not to be intercepted by third parties. A further not so apparent advantageous property is its high input impedance nature as contrasted with the injection modulators which are low input resistance devices having time constants that are determined essentially by the lifetime of the minority carriers for transit considerations.

As many apparently widely different embodiments of this invention may be made without departing from the spirit and scope hereof, it is to be understood that the invention is not limited to the specific embodiments hereof except as defined in the appended claims.

What is claimed is:

1. Apparatus for modulating a light beam by the intensity of an electrical signal, said apparatus comprising a semiconductor body having a generally planar p-n junction, optical means for projecting along said junction a beam of light to which the junction is transparent and to which the bulk of the body is substantially opaque, bias structure connected to electrically bias the junction in the current blocking direction, modulator means connected to vary the bias in accordance with the desired modulation of light, and receiver means to accept the light which is passed through said semiconductor body.

2. An apparatus for modulating a light beam by variations in the intensity of an electrical signal, said apparatus comprising a semiconductor body having a p-n junction, said junction biased in the blocking direction by means of an applied potential, means for varying the magnitude of said applied potential, optical structure so constructed and arranged as to project along said junction a beam of light waves to which the reversely biased junction is transparent and to which the bulk of said body is substantially opaque and receiver structure so located as to receive light waves which pass through said semiconductor body.

3. The combination of claim 2 in which the semiconductor body is indium antimonide and in which the generally planar p-n junction joins zones having impurities of cadmium and tellurium, respectively.

4. The combination of claim 1 in which the semiconductor body is shielded from the projected light except at the junction by reflective shields.

References Cited in the file of this patent

UNITED STATES PATENTS

| | | |
|---|---|---|
| 2,692,950 | Wallace | Oct. 26, 1954 |
| 2,692,952 | Briggs | Oct. 26, 1954 |
| 2,776,367 | Lehovec | Jan. 1, 1957 |
| 2,778,802 | Willardson | Jan. 22, 1957 |
| 2,790,088 | Shive | Apr. 23, 1957 |